United States Patent
Li et al.

(10) Patent No.: US 9,411,233 B2
(45) Date of Patent: Aug. 9, 2016

(54) SUPPORT STAGE

(71) Applicants: BOE Technology Group Co., Ltd., Beijing (CN); Beijing BOE Display Technology Co., Ltd., Beijing (CN)

(72) Inventors: Xinghuo Li, Beijing (CN); Tao Wang, Beijing (CN); Peng Wang, Beijing (CN); Zhenyong Ding, Beijing (CN); Yajun Han, Beijing (CN); Guo Chen, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 105 days.

(21) Appl. No.: 14/445,340

(22) Filed: Jul. 29, 2014

(65) Prior Publication Data
US 2015/0227044 A1 Aug. 13, 2015

(30) Foreign Application Priority Data

Feb. 13, 2014 (CN) .......................... 2014 1 0050194

(51) Int. Cl.
*G03F 7/16* (2006.01)
*G02F 1/13* (2006.01)
*H01L 21/687* (2006.01)

(52) U.S. Cl.
CPC ................ *G03F 7/16* (2013.01); *G02F 1/1303* (2013.01); *H01L 21/68742* (2013.01)

(58) Field of Classification Search
CPC ...... B25B 5/006; B25B 5/062; B25B 11/002; B23Q 3/186; B23Q 7/005
See application file for complete search history.

(56) References Cited

U.S. PATENT DOCUMENTS

| 3,948,502 A | * | 4/1976 | Waller | ................. F15B 15/063 269/27 |
|---|---|---|---|---|
| 5,520,038 A | | 5/1996 | Clark et al. | |
| 5,954,319 A | * | 9/1999 | Yonezawa | ............... B25B 5/062 269/24 |
| 6,024,354 A | * | 2/2000 | Yonezawa | ............ B23Q 1/0081 269/309 |
| 8,777,197 B2 | * | 7/2014 | Yokota | .................... B25B 5/062 269/20 |
| 2003/0189279 A1 | * | 10/2003 | Yonezawa | ............... B25B 5/062 269/24 |

(Continued)

FOREIGN PATENT DOCUMENTS

| CN | 1721933 A | 1/2006 |
|---|---|---|
| CN | 201836344 U | 5/2011 |

(Continued)

OTHER PUBLICATIONS

First Office Action, including Search Report, for Chinese Patent Application No. 201410050194.6, dated Nov. 3, 2015, 11 pages.

*Primary Examiner* — Lee D Wilson
(74) *Attorney, Agent, or Firm* — Westman, Champlin & Koehler, P.A.

(57) ABSTRACT

A support stage comprises a body; at least one pin hole disposed in the body; a lift pin which is received in the pin hole and movable upwards or downwards; at least one groove disposed on a hole wall of the pin hole; and balls which are accommodated in the groove and capable of freely rolling in the groove, wherein the groove is disposed around the lift pin, and is shaped and sized such that each ball is capable of rolling in the groove and a part of each ball projects beyond the hole wall of the pin hole even when the each ball is pressed by the lift pin. With the support stage according to the embodiment of the present invention, the balls are disposed in the groove of the pin hole. In this way, generation of the particles can be alleviated.

20 Claims, 2 Drawing Sheets

(56) References Cited

U.S. PATENT DOCUMENTS

2009/0152784 A1* 6/2009 Yonezawa ............... B25B 5/062
269/32
2015/0227044 A1* 8/2015 Li ........................ G02F 1/1303
118/500

FOREIGN PATENT DOCUMENTS

| CN | 102094961 A | 6/2011 |
| CN | 202049933 U | 11/2011 |
| KR | 10-2007-0119386 A | 12/2007 |

* cited by examiner

SUPPORT STAGE

CROSS-REFERENCE TO RELATED APPLICATION

This application claims the benefit of Chinese Patent Application No. 201410050194.6 filed on Feb. 13, 2014 in the State Intellectual Property Office of China, the whole disclosure of which is incorporated herein by reference.

BACKGROUND OF THE INVENTION

1. Field of the Invention

Embodiments of the present invention relate to the field of liquid crystal display manufacture, and particularly to a support stage.

2. Description of the Related Art

In a photolithographic process of liquid crystal display manufacture, a linear coater is adopted to apply photoresist. In order to ensure a thickness of a photoresist film, a glass substrate needs to be adsorbed by vacuum on a coater stage and stability of the glass substrate needs to be ensured. Generally, pin holes which pass through the coater stage in a thickness direction are disposed in the coater stage. Lift pins are located in the pin holes. When the glass substrate is taken or placed, the lift pins lift the glass substrate.

The lift pin as an important element for taking and placing the glass substrate is easily bent by receiving an external force so that during lifting, sliding friction between the lift pin and the pin hole occurs to generate particles. The particles are brought to a surface of the coater stage so that they may be adsorbed to the glass substrate, thereby causing a shell mura of a liquid crystal panel. When the particles adsorbed to the glass substrate are too big or the number of the particles is too large, a defect alarm is even triggered and a yield is adversely affected.

SUMMARY OF THE INVENTION

The object of the embodiment of the present invention is to provide a support stage, thereby alleviating or avoiding occurrence of sliding friction between lift pins and pin holes of a coater stage to generate particles and thus preventing generation of a shell mura on a liquid crystal panel.

In accordance with an embodiment of the present invention, there is provided a support stage comprising: a body; at least one pin hole disposed in the body; a lift pin which is received in the pin hole and movable upwards or downwards; at least one groove disposed on a hole wall of the pin hole; and balls which are accommodated in the groove and capable of freely rolling in the groove, wherein the groove is disposed around the lift pin, and is shaped and sized such that each ball is capable of rolling in the groove and a part of each ball projects beyond the hole wall of the pin hole even when the each ball is pressed by the lift pin.

DETAILED DESCRIPTION OF THE EMBODIMENTS

Figure 1:
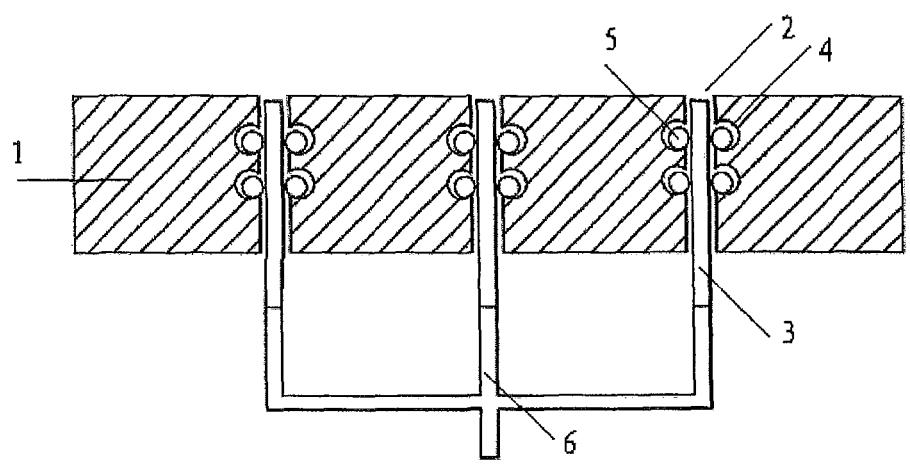
FIG. 1 is a schematic partial sectional view of a support stage according to an embodiment of the present invention which is taken along a vertical direction.

A further description of the invention will be made in detail as below with reference to embodiments of the present invention taken in conjunction with the accompanying drawings. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

According to a general concept of the present invention, there is provided a support stage comprising: a body; at least one pin hole disposed in the body; a lift pin which is received in the pin hole and movable upwards or downwards; at least one groove disposed on a hole wall of the pin hole; and balls which are accommodated in the groove and capable of freely rolling in the groove, wherein the groove is disposed around the lift pin, and is shaped and sized such that each ball is capable of rolling in the groove and a part of each ball projects beyond the hole wall of the pin hole when each ball is pressed by the lift pin.

A further description of the invention will be made in detail as below with reference to embodiments of the present invention taken in conjunction with the accompanying drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
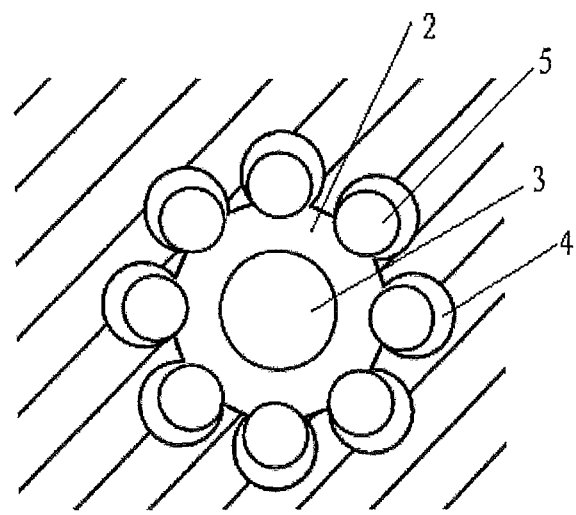
FIG. 2 is a schematic partial sectional view of a pin hole of the support stage according to an embodiment of the present invention which is taken at a groove of the pin hole along a horizontal direction.

FIG. 1 is a schematic partial sectional view of a support stage according to an embodiment of the present invention which is taken along a vertical direction, and FIG. 2 is a schematic partial sectional view of a pin hole of the support stage according to an embodiment of the present invention which is taken at a groove of the pin hole along a horizontal direction. As shown in FIG. 1, the support stage 1 has a horizontal surface on which a substrate is placed.

The support stage 1 comprises: a body; at least one pin hole 2 disposed in the body; a lift pin 3 which is received in the pin hole 2 and movable upwards or downwards; a groove 4 disposed on a hole wall of the pin hole 2; and a plurality of balls 5 which are accommodated in the groove 4 and capable of freely rolling in the groove 4. The groove 4 is disposed around the lift pin 3, and is shaped and sized such that each ball 5 is capable of rolling in the groove 4 and a part of each ball 5 always projects beyond the hole wall of the pin hole 2. In particular, a part of each ball 5 projects beyond the hole wall of the pin hole 2 even when the each ball 5 is pressed by the lift pin 3. As shown in FIG. 1, the lift pin 3 is mounted to a lifter 6. The lift pin 3 can be controlled to ascend or descend by the lifter 6. A depth of the groove 4 is less than a diameter of the ball 5. For example, the depth of the groove 4 in a radial direction of the pin hole 2 is less than the diameter of the ball 5. The grooves 4 may be disposed on the hole wall of each pin hole 2 near both ends of the each pin hole 2, respectively. The groove 4 has an opening which opens to the pin hole 2, and the opening of the groove 4 is sized such that the balls 5 cannot pass through the opening. Thereby, the balls 5 are retained within the groove 4.

The rollable balls 5 are disposed in the groove of the pin hole 2. Therefore, if a trajectory of the lift pin 3 is inclined when the lift pin 3 receives an external force, a sliding friction between the lift pin and the wall of the pin hole when they come into contact with each other can be converted into a rolling friction between the lift pin and the balls 5 through the ball 5. In this way, generation of the particles can be alleviated so that the particles adsorbed to the substrate are greatly decreased, thereby preventing generation of a shell mura on a liquid crystal panel, and improving a yield of the liquid crystal panel.

Of course, the support stage is also applicable to manufacture processes of other products. In this case, the support stage can also function to reduce the particles generated due to friction during the manufacture processes and thus reduce contamination of and affection on the products.

Figure 3:
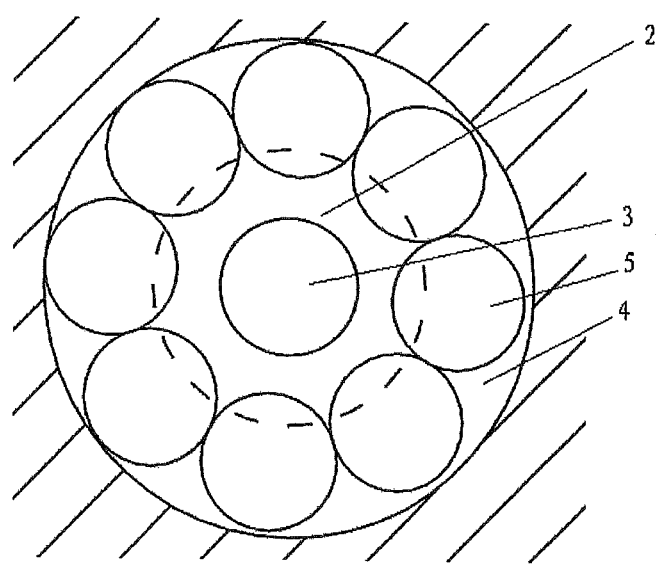
FIG. 3 is a schematic partial sectional view of the pin hole of the support stage according to another embodiment of the present invention which is taken at the circular ring-shaped groove of the pin hole along a horizontal direction.

As shown in FIGS. 2 and 3, the groove 4 is formed in the hole wall of the pin hole. There may be a gap between the balls 5 and the lift pin 3 so that when the trajectory of the lift pin 3 is not inclined, the balls 5 and the lift pin 3 are not in contact with each other. In this way, additional friction can be avoided. All of the balls 5 may have the same size. The balls 5 are preferably made of ceramics. The ceramics has a good resistance to friction and can more effectively alleviate generation of the particles.

In an embodiment, as shown in FIG. 2, the groove 4 comprises a plurality of ball sockets which are not in communication with each other and have a shape of part of a sphere, and each ball 5 is accommodated in one ball socket 4. The plurality of ball sockets of each groove 4 may be disposed substantially on the same circumference or at the same height. For example, the plurality of ball sockets of each groove 4 may be disposed substantially on the same circumference or at the same height, for example at the same circumference with a center on an axis of the pin hole 2 or at the same height at the same distance from the axis of the pin hole 2. The part of the sphere may be formed by cutting away the other part of the sphere by a surface of the hole wall of the pin hole 2. The surface of the hole wall of the pin hole 2 may comprise a circular cylindrical surface or a surface of any other shape. A depth of the ball socket 4 is less than the diameter of the ball 5. For example, the depth of the ball socket 4 in the radial direction of the pin hole 2 is less than the diameter of the ball 5. The ball socket 4 has an opening which opens to the pin hole 2, and the opening of the ball socket 4 is sized such that the balls 5 cannot pass through the opening. Thereby, the balls 5 are retained within the ball socket 4. In another embodiment, as shown in FIG. 3, the groove 4 comprises a horizontal circular ring-shaped groove 4, and the balls 5 are accommodated in each circular ring-shaped groove 4. A cross section of the circular ring-shaped groove 4 may have a shape of part of a circle. The part of the circle may be formed by cutting away the other part of the circle by the surface of the hole wall of the pin hole 2. The surface of the hole wall of the pin hole 2 comprises a circular cylindrical surface or a surface of any other shape. The cross section of the circular ring-shaped groove 4 may have any other shape. The circular ring-shaped groove 4 has an opening which opens to the pin hole 2, and the diameter of the ball 5 is greater than a width of the opening of the circular ring-shaped groove 4 so that the balls 5 are retained in the groove 4. The width or depth of the circular ring-shaped groove 4 in the radial direction of the pin hole 2 is less than the diameter of the ball 5. In this way, when the lift pin 3 is deflected or bent, it cannot come into contact with the hole wall of the pin hole, but comes into contact with the balls 5 so that the sliding friction is converted into the rolling friction. Each pin hole 3 may be provided with a plurality of the circular ring-shaped grooves 4 and each circular ring-shaped groove 4 accommodates a plurality of the balls 5. In this way, the lift pin 3 can be prevented from coming into contact with the hole wall of the pin hole when it is excessively bent. Preferably, one circular ring-shaped groove 4 is disposed on the hole wall of each pin hole 2 near each of the two ends of the each pin hole 2 or two circular ring-shaped grooves 4 are disposed on the hole wall of each pin hole 2 near the two ends of the each pin hole 2, respectively.

With the support stage according to the embodiment of the present invention, the groove is disposed in the hole wall of the pin hole and the freely rollable balls are disposed in the groove. Thereby, the sliding friction between the lift pin and the hole wall of the pin hole when the lift pin is deflected or bent is converted into the rolling friction between the lift pin and the balls. In this way, generation of the particles can be alleviated so that the particles adsorbed to the liquid crystal panel are greatly decreased, thereby preventing generation of the shell mura on the liquid crystal panel, and improving a yield of the liquid crystal panel.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

The invention claimed is:

1. A support stage comprising:
a body;
at least one pin hole disposed in the body;
a lift pin which is received in the pin hole and movable upwards or downwards;
at least one groove disposed on a hole wall of the pin hole; and
balls which are accommodated in the groove and capable of freely rolling in the groove, wherein the groove is disposed around the lift pin, and is shaped and sized such that each ball is capable of rolling in the groove and a part of each ball projects beyond the hole wall of the pin hole even when the each ball is pressed by the lift pin,
wherein the lift pin is movable upwards or downwards relative to the hole wall without rotating.

2. The support stage of claim 1, wherein:
each groove comprises a plurality of ball sockets which are not in communication with each other and have a shape of part of a sphere, and one of the balls is accommodated in each ball socket.

3. The support stage of claim 2, wherein:
the ball sockets of each groove are disposed substantially on a same circumference or at a same height.

4. The support stage of claim 2, wherein:
the part of the sphere is formed by cutting away the other part of the sphere by a surface of the hole wall of the pin hole.

5. The support stage of claim 4, wherein:
the surface of the hole wall of the pin hole comprises a circular cylindrical surface.

6. The support stage of claim 1, wherein:
the groove comprises a horizontal circular ring-shaped groove, and the balls are accommodated in each circular ring-shaped groove.

7. The support stage of claim 6, wherein:
a cross section of the circular ring-shaped groove has a shape of part of a circle.

8. The support stage of claim 7, wherein:
the part of the circle is formed by cutting away the other part of the circle by a surface of the hole wall of the pin hole.

9. The support stage of claim 8, wherein:
the surface of the hole wall of the pin hole comprises a circular cylindrical surface.

10. The support stage of claim 6, wherein:
the circular ring-shaped grooves are disposed in the hole wall of each pin hole and the balls are accommodated in each circular ring-shaped groove.

11. The support stage of claim 10, wherein:
the one circular ring-shaped groove is disposed on the hole wall of each pin hole near each of both ends of the each pin hole.

12. The support stage of claim 1, wherein:
the grooves are disposed on the hole wall of each pin hole near both ends of the each pin hole, respectively.

13. The support stage of claim 1, wherein:
there is a gap between the balls and the lift pin so that when the lift pin is not deflected by a force, the balls and the lift pin are not in contact with each other.

14. The support stage of claim 1, wherein:
all of the balls have a same size.

15. The support stage of claim 1, wherein:
the balls are made of ceramics.

16. The support stage of claim 1, wherein:
the groove has a depth less than a diameter of the ball.

17. The support stage of claim 6, wherein:
the circular ring-shaped groove has an opening which opens to the pin hole, and the diameter of the ball is greater than a width of the opening of the circular ring-shaped groove.

18. The support stage of claim 1, wherein:
the groove has an opening which opens to the pin hole, and the opening of the groove is sized such that the balls cannot pass through the opening.

19. The support stage of claim 1, further comprising:
a lifter, wherein the lift pin is mounted to the lifter and configured to be lifted by the lifter.

20. The support stage of claim 6, wherein:
the width or depth of the circular ring-shaped groove in a radial direction of the pin hole is less than the diameter of the ball.

* * * * *